US010910304B2

(12) United States Patent
Stamper et al.

(10) Patent No.: US 10,910,304 B2
(45) Date of Patent: Feb. 2, 2021

(54) TIGHT PITCH WIRINGS AND CAPACITOR(S)

(71) Applicant: GLOBALFOUNDRIES INC., Grand Cayman (KY)

(72) Inventors: Anthony K. Stamper, Burlington, VT (US); Daisy A. Vaughn, Stowe, VT (US); Stephen R. Bosley, Essex Junction, VT (US); Zhong-Xiang He, Essex Junction, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/256,595

(22) Filed: Jan. 24, 2019

(65) Prior Publication Data
US 2020/0243439 A1 Jul. 30, 2020

(51) Int. Cl.
| | |
|---|---|
| H01L 23/522 | (2006.01) |
| H01L 27/08 | (2006.01) |
| H01L 49/02 | (2006.01) |
| H01G 4/33 | (2006.01) |
| H01G 4/08 | (2006.01) |
| H01G 4/232 | (2006.01) |
| H01L 23/528 | (2006.01) |

(52) U.S. Cl.
CPC ........... *H01L 23/5223* (2013.01); *H01G 4/08* (2013.01); *H01G 4/232* (2013.01); *H01G 4/33* (2013.01); *H01L 23/528* (2013.01); *H01L 27/0805* (2013.01); *H01L 28/40* (2013.01)

(58) Field of Classification Search
None
See application file for complete search history.

(56) References Cited

U.S. PATENT DOCUMENTS

| | | | |
|---|---|---|---|
| 6,576,526 B2 | 6/2003 | Kai et al. | |
| 8,191,217 B2 | 6/2012 | Dunn et al. | |
| 8,375,539 B2 | 2/2013 | Dunn et al. | |
| 9,601,545 B1* | 3/2017 | Tu | H01L 28/60 |
| 2004/0219757 A1* | 11/2004 | Olewine | H01L 28/60 |
| | | | 438/381 |
| 2011/0108951 A1* | 5/2011 | Cho | H01L 21/31144 |
| | | | 257/532 |
| 2011/0133250 A1* | 6/2011 | Lee | H01L 27/0605 |
| | | | 257/197 |
| 2013/0221486 A1* | 8/2013 | Sato | H01L 23/5223 |
| | | | 257/532 |

FOREIGN PATENT DOCUMENTS

| | | |
|---|---|---|
| CN | 101295663 | 10/2008 |
| TW | 200520144 | 6/2005 |

OTHER PUBLICATIONS

Taiwanese Office Action in related TW Application No. 108146987 dated Aug. 17, 2020, 9 pages.

* cited by examiner

*Primary Examiner* — Khaja Ahmad
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to tight pitch wirings and capacitors and methods of manufacture. The structure includes: a capacitor including: a bottom plate of a first conductive material; an insulator material on the bottom plate; and a top plate of a second conductive material on the insulator material; and a plurality of wirings on a same level as the bottom plate and composed of the second conductive material.

20 Claims, 3 Drawing Sheets

TIGHT PITCH WIRINGS AND CAPACITOR(S)

FIELD OF THE INVENTION

The present disclosure relates to semiconductor structures and, more particularly, to tight pitch wirings and capacitors and methods of manufacture.

BACKGROUND

Metal insulator metal (MIM) capacitors can be integrated with sub-etch wirings as known in the art, e.g., AlCu, TiN, W, Ta, or similar metals used in integrated circuits. In such combination of structures, a bottom plate of the MIM capacitor and the sub-etch wiring are shared, i.e., have the same metal material including thickness. However, difficulty arises in the patterning and etching of tight pitch wiring on the same level as the bottom plate of the MIM capacitor. This is due to the need for a low resistance MIM bottom plate, especially when vias are not used under the MIM capacitor.

To form a low resistance MIM bottom plate, it needs to be made relatively thick. There is also an inability to shrink sub-etch wiring height since "thick" MIM bottom plates are required for the quality factor (Q). It is also not always possible to place vias under the MIM bottom plate, which would reduce its resistance, due to yield or reliability issues such as plasma charging damage.

SUMMARY

In an aspect of the disclosure, a structure comprises: a capacitor including: a bottom plate of a first conductive material; an insulator material on the bottom plate; and a top plate of a second conductive material on the insulator material; and a plurality of wirings on a same level as the bottom plate and composed of the second conductive material.

In an aspect of the disclosure, a structure comprises: a metal insulator metal (MIM) capacitor comprising a bottom plate, an insulator material on the bottom plate; and a top plate on the insulator material; and a plurality of wirings composed of a same continuous stack as the top plate of the MIM capacitor.

In an aspect of the disclosure, a method comprises: depositing a first conductive material on an underlying dielectric material; depositing an insulator material on the first conductive material; patterning the first conductive material and the insulator material simultaneously to form a bottom plate and an insulator layer of a capacitor; depositing a second conductive material on the insulator layer and the underlying dielectric material; and patterning the second conductive material to simultaneously form a top plate of the capacitor and a plurality of wiring layers on the underlying dielectric material, wherein the plurality of wiring layers and the top plate and of a same stack.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
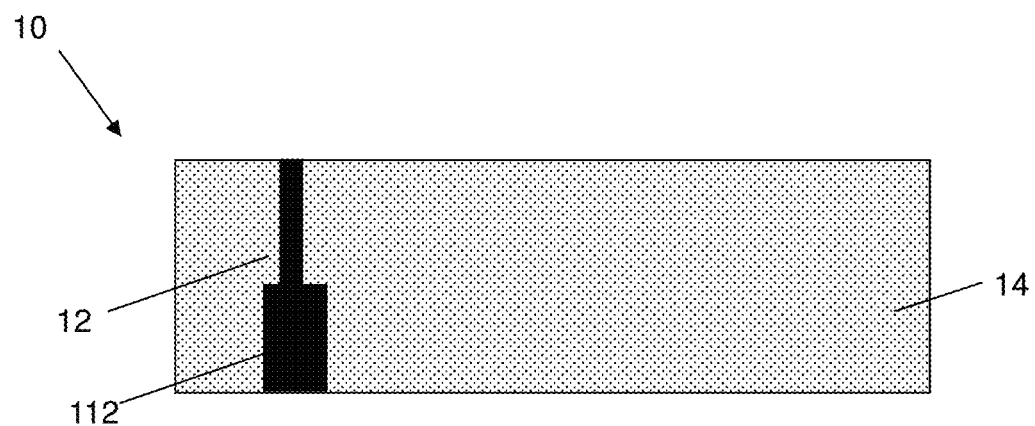
FIG. 1A shows a wafer with one or more metallized vias extending downwards from a top surface of the wafer to underlying wires, amongst other features, and respective fabrication processes in accordance with aspects of the present disclosure.

The present disclosure relates to semiconductor structures and, more particularly, to tight pitch wirings and capacitors and methods of manufacture. More specifically, the present disclosure is directed to tight pitch AlCu wirings and metal insulator metal (MIM) capacitor structure(s). Advantageously, the present disclosure allows for tight pitch wirings which are etched after tight pitch wiring metal deposition, compared to after the deposition of an insulator (e.g., nitride deposition) and top plate metal deposition/etching processes for the MIM capacitor. This allows for thinning of the tight pitch wiring(s) to tighten the pitch without degrading the MIM quality factor (Q) due to a thin bottom plate of the MIM capacitor. In addition, a lack of dielectric material or dielectric material and metal (e.g., Ti layers of the MIM capacitor) on the tight pitch wirings allows for reduced pitch since the maximum metal etch aspect ratio includes the nitride and other layers, such as Ti layers.

In embodiments, methods of fabricating the tight pitch wirings and MIM capacitor(s) replace many conventional processing steps of the MIM capacitor. Illustratively, the methods of fabrication no longer require, e.g., deposition of metal/nitride/metal or metal/Ti/nitride/metal+pattern/etch+pattern/etch stack with metal deposition+pattern/etch+metal deposition+metal pattern/etch fabrication processes. Instead, in embodiments, the processes described herein will form the top capacitor plate and the tight pitch wirings in a same metal deposition and patterning process. For example, the bottom plate and insulator material of the MIM capacitor are first deposited and patterned, followed by the simultaneous deposition and patterning of the top plate of the MIM capacitor and tight pitch wirings.

By implementing the processes herein, the top plate of the MIM capacitor and tight pitch wirings are the same continuous stack but are formed at the same metal stack and the MIM bottom plate is formed from a different metal stack than the tight pitch wirings. That is, the MIM top plate and adjacent wirings are formed simultaneously from a same metal deposition, but at a different level. Also, the bottom plate of the MIM capacitor could be formed from a different metal layer than the MIM top plate and wirings so that the Q factor for the MIM capacitor is not degraded if the tight pitch wiring thickness is reduced. In other words, the bottom plate of the MIM capacitor can be formed as tall or as thick as required, without regard to the wirings on the same level.

In addition, the MIM capacitor and the tight pitch wirings can be spaced apart, e.g., about 30 μm apart; although other dimensions are also contemplated herein. More specifically, the tight pitch wirings are spaced away from the bottom plate of the MIM capacitor that is formed prior to the tight pitch wirings. One possible equation used for spacing of the MIM capacitor and tight pitch wirings can be:

30 microns*thickness of MIM bottom plate/(2×min critical dimension of tight pitch wire)

For example, using the above equation the spacing for 130 nm generation device can be calculated as follows: 30 microns*0.28 micron/(2×0.20 micron)=21 microns. Spacing the MIM bottom plate and tight pitch wirings is needed if the photoresist that is used to pattern the tight pitch wiring has greater thickness due to it being thicker over the MIM bottom plate, due to imperfect planarization of the photoresist. It is desirable to have the same thickness tight pitch wiring photoresist in areas away from the MIM, to avoid having different resist thicknesses, which can cause problems with exposing and printing the photoresist.

The tight pitch wirings and capacitor(s) of the present disclosure can be manufactured in a number of ways using a number of different tools. In general, though, the methodologies and tools are used to form structures with dimensions in the micrometer and nanometer scale. The methodologies, i.e., technologies, employed to manufacture the tight pitch wiring and capacitor structures of the present disclosure have been adopted from integrated circuit (IC) technology. For example, the structures are built on wafers and are realized in films of material patterned by photolithographic processes on the top of a wafer. In particular, the fabrication of the tight pitch wirings and capacitor(s) use three basic building blocks: (i) deposition of thin films of material on a substrate, (ii) applying a patterned mask on top of the films by photolithographic imaging, and (iii) etching the films selectively to the mask.

FIG. 1A shows a wafer 14 with one or more metallized vias 12 extending downwards from a top surface of the wafer 14 to underlying wires 112. More specifically, the structure 10 of FIG. 1A shows an optional wiring 112 and interconnect structure 12 embedded in an underlying insulator material 14. In embodiments, the insulator material 14 can be any insulator material such as, e.g., $SiO_2$. The optional wiring 112 and interconnect structure 12 can be formed by conventional lithography, etching and deposition processes known to those of skill in the art such that no further explanation is required herein for a complete understanding of the present disclosure.

Figure 1B:
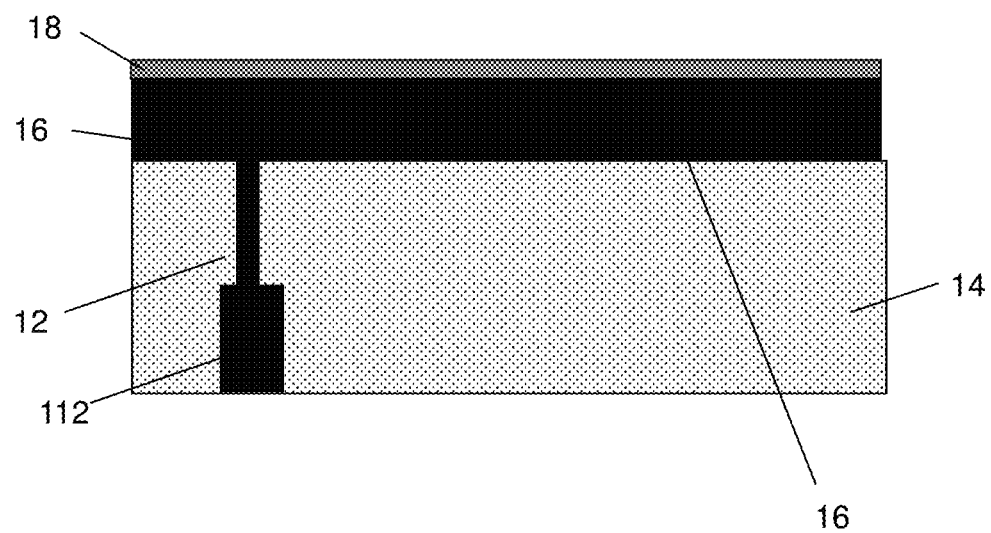
FIG. 1B shows a blanket deposition of a metal and dielectric material (insulator material), amongst other features, and respective fabrication processes in accordance with aspects of the present disclosure.
Figure 2:
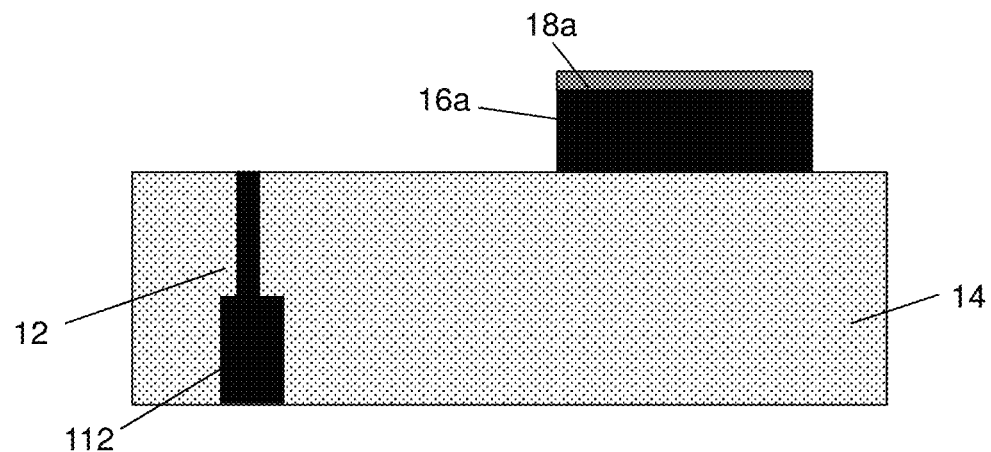
FIG. 2 shows a bottom plate and insulator layer of a MIM capacitor, amongst other features, and respective fabrication processes in accordance with aspects of the present disclosure.

FIG. 1B shows the deposition of the metal 16 and dielectric material (insulator material) 18 that will eventually form the MIM bottom plate and insulator layer of the MIM capacitor as shown in FIG. 2. In embodiments, the metal 16 can be, for example, a combination of a low resistance metal such as AlCu cladded above and below with thinner layers of refractory metals such as $TiAl_3$, TiN, Ti, W, Ta, or TaN; although other conductive material is also contemplated herein as is known in the art. The insulator material 18 can be a nitride material, for example. Moreover, further dielectrics to form the MIM capacitor can include, for example and by way of non-limiting illustration, $SiO_2$, SiN, $Ta_2O_5$, $Al_2O_3$, etc. as known in the art.

As should be understood, the metal 16 and the insulator material 18 are formed by conventional deposition processes. For example, the metal 16 and the insulator material 18 can be deposited using a conventional physical vapor deposition (PVD), chemical vapor deposition (CVD), atomic layer deposition (ALD), or other process as known in the art.

FIG. 2 shows a bottom plate and insulator layer of a MIM capacitor, amongst other features, and respective fabrication processes in accordance with aspects of the present disclosure. The bottom plate 16a and insulator layer 18a of the MIM capacitor are formed on the insulator material 14. In embodiments, the bottom plate 16a is formed from the metal layer 16 and the insulator layer 18a is formed from the insulator material 18 both of which are shown in FIG. 1B.

As should be understood, following the deposition of the metal 16 and the insulator material 18, the layers are subjected to lithography and etching processes to form the bottom plate 16a and the insulator layer 18a of the MIM capacitor. For example, the bottom plate 16a and the insulator material 18a can be deposited using a conventional physical vapor deposition (PVD), chemical vapor deposition (CVD), atomic layer deposition (ALD), or other process as known in the art, followed by lithography and etching processes. In embodiments, the bottom plate 16a can have a thickness (also referred to as height) of about 0.5 microns; although other dimensions are contemplated herein depending the design parameters, e.g., types of materials used and/or performance requirements. The insulator material 18a can have a thickness of about 0.02 to 0.2 microns; although other dimensions are contemplated herein depending the design parameters, e.g., types of materials used and/or performance requirements as known in the art to form MIM capacitors.

The lithography and etching processes to form the bottom plate 16a and the insulator material 18a comprise a resist formed over the insulator material 18 of FIG. 1B, which is exposed to energy (light) to form a pattern (opening). An etching process with a selective chemistry, e.g., reactive ion etching (RIE), will be used to form the pattern of the bottom plate 16a and the insulator material 18a of the MIM capacitor. In embodiments, more than one bottom plate 16a and insulator material 18a can be patterned to form more than one MIM capacitor. The resist can be removed by a conventional ashing process using, for example, oxygen or oxygen and $CF_4$, or other known stripants.

Figure 3A:
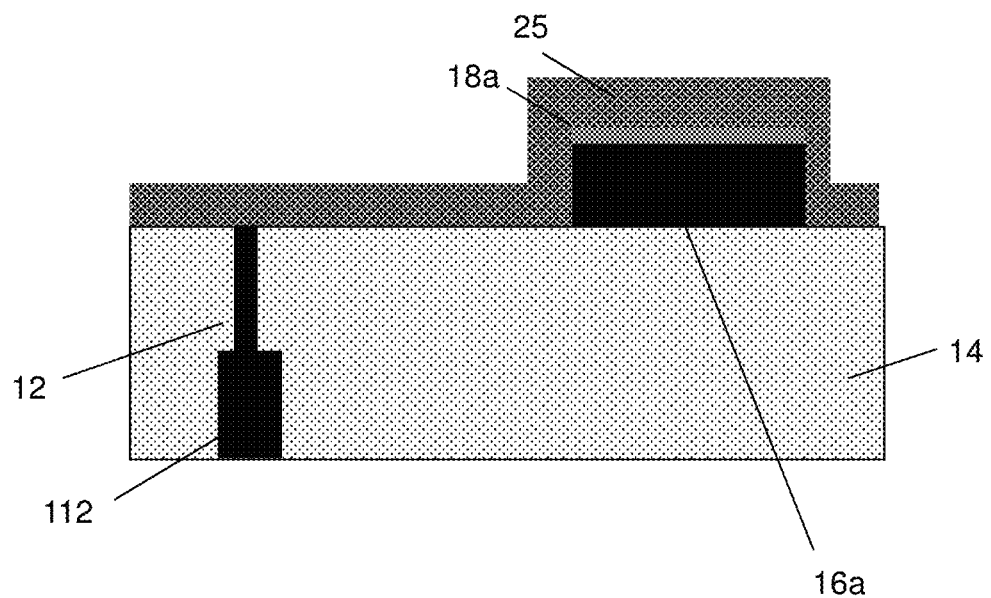
FIG. 3A shows a metal deposition layer that will form tight pitch wirings and a MIM capacitor top plate, and respective fabrication processes in accordance with aspects of the present disclosure.
Figure 3B:
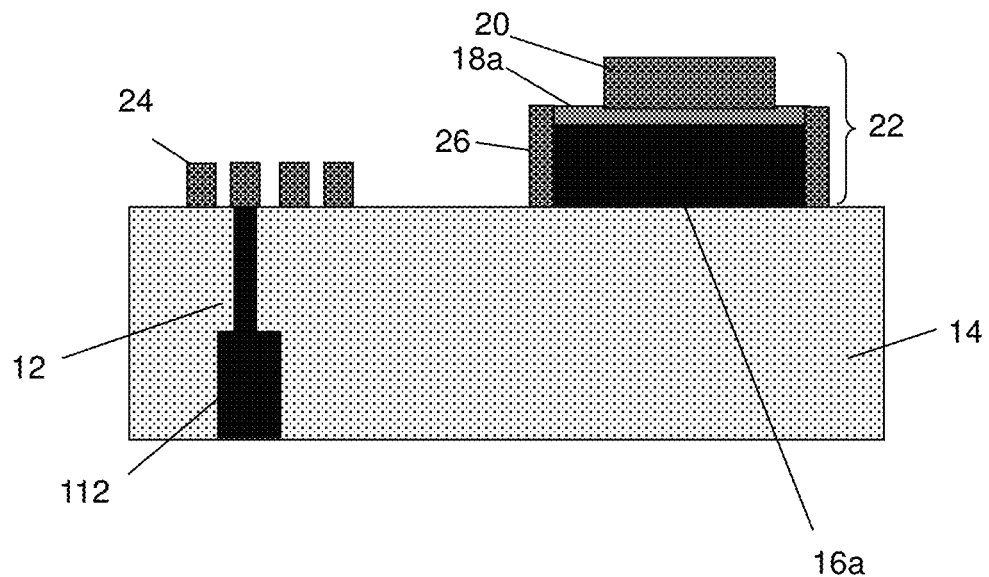
FIG. 3B shows a top plate of the MIM capacitor and tight pitch wirings, amongst other features, and respective fabrication processes in accordance with aspects of the present disclosure.

FIG. 3A shows a metal deposition layer 25 that will form the tight pitch wiring and the MIM capacitor top plate as shown in FIG. 3B. This metal layer 25 will also deposit on the side of the MIM lower plate (bottom plate) 16a. If the metal deposition is not conformal, the side thickness of the metal layer 25 could be less than the thickness over the planar wafer, itself, or the thickness over the MIM bottom plate 16a.

By way of example, the metal material 25 is blanket deposited over the insulator material 18a and the insulator material 14, and optionally in contact with the underlying wiring 112 and interconnect structure 12. The deposition process can be, e.g., a PVD, CVD, ALD, etc., process, which deposits the metal material 25 to a thickness (also referred to as height) of about 0.25 microns; although other dimensions are also contemplated herein. For example, the metal material 25 can be deposited to the same thickness or less as the bottom plate 16a of the MIM capacitor. By having a single deposition process, the thickness and metal stack of the top plate 20 and the tight pitch wirings 24 as shown in FIG. 3B will be the same, thereby decoupling the height of the wirings from the height of the bottom plate 16a.

In addition, it is contemplated that the metal material 25 could be a different conductive material than the bottom plate 16a of the MIM capacitor, more preferably used for the wirings 24 as shown in FIG. 3B. As a non-limiting embodiment, the metal material for the top plate 20 and the tight pitch wirings 24 can be, e.g., AlCu cladded with refractory metals such as Ti, TiAl₃, TiN, W, Ta, TaN, etc.

FIG. 3B shows a top plate 20 of the MIM capacitor 22 and tight pitch wirings 24 and respective fabrication processes formed from the metal deposition layer 25 shown in FIG. 3A. As shown in FIG. 3B, the top plate 20 and the tight pitch wirings 24 are formed in the same deposition and patterning processes. In this way, the metal material (metal material 25 shown in FIG. 3A) used for the wirings 24 can be decoupled from the bottom plate 16a of the MIM capacitor 22. For example, the metal material 25 that was blanket deposited over the insulator material 18a and the insulator material 14, and optionally in contact with the underlying wiring and interconnect structure 12 can be patterned to form the top plate 20 and the tight pitch wirings 24.

More specifically, following the deposition of the metal material 25, lithography and etching processes are performed to pattern the metal material into the top plate 20 and the tight pitch wirings 24. The bottom plate 16a and the tight pitch wirings 24 can be spaced apart from one another, e.g., 30 microns; although different spacing is contemplated herein depending on the technology node. In embodiments, the etching will also result in a spacing (pitch) between the wirings 24 of about half the metal thickness, e.g., 0.12 microns if the metal thickness is about 0.25 microns; although different spacing (pitches) is contemplated herein depending on the technology node ranging roughly over a thickness range of 50 nm to 1 micron. As further shown in FIG. 3B, one of the wirings 24 remain in contact with the underlying wiring and interconnect structure 12, after the etching process.

FIG. 3B further shows an optional spacer 26 on one or any combination of sides of the bottom plate 16a of the MIM capacitor 22. In embodiments, the spacer 26 is preferably the metal material used for the top plate 20 and tight pitch wirings 24, which can be formed in the same deposition and patterning processes. For example, after the deposition of the metal material, the spacer will be formed during the etching step (with an appropriate mask) so that it remains on one or any combination of the sidewalls of the bottom plate 16a. In this way, the bottom plate 16a and top plate 20 are composed of two different metal materials. The metal spacer material 26 could be formed if the metal etch process was anisotropic, such that the metal etched faster in the 0 degree regions of the wafer above the tight pitch wiring 24 and MIM bottom plate 16a. If an isotropic etching process was used, then this metal spacer 26 material would not be present on the wafer.

Figure 4:
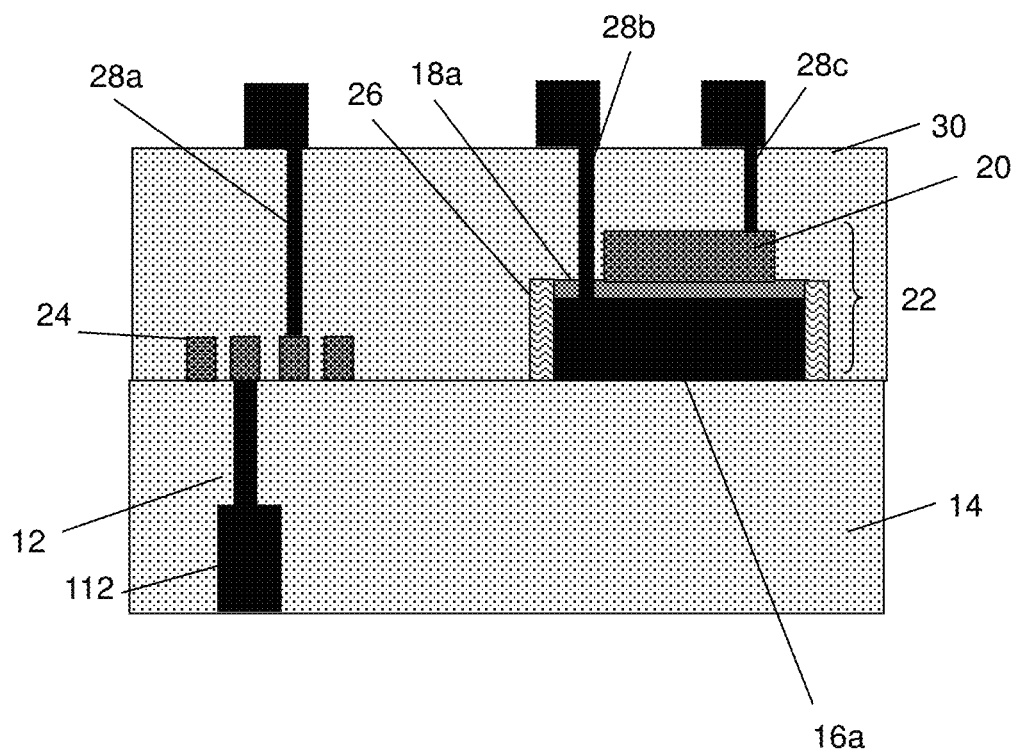
FIG. 4 shows interconnect and wiring structures connecting to the MIM capacitor and the wirings, amongst other features, and respective fabrication processes in accordance with aspects of the present disclosure.

FIG. 4 shows additional wirings and interconnect (via) structures to the MIM capacitor 22 and the wirings 24. More specifically, wiring and interconnect structure 28a is in direct contact with and electrically connected to one of the tight pitch wirings 24; whereas, wiring and interconnect structure 28b is in direct contact with and electrically connected to the bottom plate 16a and the wiring and interconnect structure 28c is in direct contact with and electrically connected to the top plate 20 of the MIM capacitor 22. In embodiments, the wiring and interconnect structures 28a, 28b, 28c are embedded and extend to a top surface of interlevel dielectric material 30, e.g., SiO₂. Note that the vias to both MIM plates 16a, 20 may be used to avoid charging damage.

The interconnect structures can be formed by conventional lithography, etching and deposition processes. For example, after the deposition of the interlevel dielectric material 30, a resist formed over the interlevel dielectric material 30 is exposed to energy (light) to form a pattern (opening). An etching process with a selective chemistry, e.g., RIE, will be used to form one or more vias in the interlevel dielectric material 30 through the openings of the resist. The resist can then be removed by a conventional oxygen ashing process or other known stripants. Following the resist removal, conductive material is deposited in the vias by any conventional deposition processes, e.g., CVD processes. Any residual material on the surface of the interlevel dielectric material 30 can be removed by conventional chemical mechanical polishing (CMP) processes. The wiring structures can be formed by deposition and etching processes known to those of skill in the art.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a capacitor comprising:
   a bottom plate of a first conductive material;
   an insulator layer on the bottom plate; and
   a top plate of a second conductive material on the insulator layer; and
   a plurality of wirings on a same level as the bottom plate, composed of a same continuous stack as the top plate of the capacitor, wherein both the bottom plate and the plurality of wirings contact a same underlying insulator material.

2. The structure of claim 1, wherein the plurality of wirings and the bottom plate are spaced apart by an interlevel dielectric material.

3. The structure of claim 2, wherein the plurality of wirings and the bottom plate are spaced apart by about 30 microns.

4. The structure of claim 1, wherein the bottom plate and the plurality of wirings have a different height.

5. The structure of claim 1, wherein the top plate and the plurality of wirings have a same height.

6. The structure of claim 5, wherein the top plate and the plurality of wirings are a same continuous stack formed at different heights of the structure.

7. The structure of claim 5, further comprising at least one sidewall spacer on a sidewall of the bottom plate and interlevel dielectric material separating the at least one sidewall spacer from the plurality of wirings.

8. The structure of claim 7, wherein the at least one sidewall spacer, the top plate and the plurality of wirings are of a same material.

9. The structure of claim 8, wherein the same material is AlCu.

10. The structure of claim 1, wherein the first conductive material is different than the second conductive material, and the second conductive material is AlCu.

11. A structure comprises:
- a metal insulator metal (MIM) capacitor comprising a bottom plate, an insulator material on the bottom plate, and a top plate on the insulator material;
- a plurality of wirings on a same underlying insulator material as the bottom plate and composed of a same continuous stack as the top plate of the MIM capacitor, wherein the bottom plate and the plurality of wirings contact the same underlying insulator material;
- interlevel dielectric material separating the plurality of wires from one another and from the bottom plate of the MIM capacitor;
- interconnect structures extending within the interlevel dielectric material and contacting, from a top side, the top plate and the bottom plate of the MIM capacitor and at least one of the plurality of wirings; and
- one or more metallized vias contacting one of the plurality of wirings from a bottom side.

12. The structure of claim 11, wherein the top plate and the plurality of wirings are formed at different heights and of a same conductive material.

13. The structure of claim 12, wherein the plurality of wirings are a same thickness as the top plate.

14. The structure of claim 12, wherein the plurality of wirings are a different thickness than the bottom plate and formed of a different conductive material.

15. The structure of claim 12, wherein the plurality of wirings and the bottom plate are spaced apart.

16. The structure of claim 12, further comprising at least one sidewall spacer on the bottom plate.

17. The structure of claim 16, wherein the at least one sidewall spacer, the top plate and the plurality of wirings are of a same material.

18. The structure of claim 17, wherein the same material is AlCu.

19. The structure of claim 12, wherein the bottom plate and the top plate are composed of different conductive materials.

20. The structure of claim 1, further comprising:
- interlevel dielectric material separating the plurality of wires from one another and from the bottom plate;
- interconnect structures extending within the interlevel dielectric material and contacting, from a top side, the top plate, the bottom plate and at least one of the plurality of wirings; and
- one or more metallized vias contacting at least one of the plurality of wirings from a bottom side.

* * * * *